United States Patent
Lanio et al.

(10) Patent No.: US 10,699,867 B2
(45) Date of Patent: Jun. 30, 2020

(54) SIMPLIFIED PARTICLE EMITTER AND METHOD OF OPERATING THEREOF

(71) Applicant: ICT Integrated Circuit Testing Gesellschaft für Halbleiterprüftechnik mbH, Heimstetten (DE)

(72) Inventors: Stefan Lanio, Erding (DE); Jürgen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 15/970,440

(22) Filed: May 3, 2018

(65) Prior Publication Data

US 2018/0254165 A1  Sep. 6, 2018

Related U.S. Application Data

(63) Continuation of application No. 12/910,240, filed on Oct. 22, 2010, now abandoned.

(30) Foreign Application Priority Data

Oct. 19, 2010 (EP) .................................... 10187979

(51) Int. Cl.
*H01J 37/063* (2006.01)
*H01J 37/06* (2006.01)
(Continued)

(52) U.S. Cl.
CPC ............ *H01J 37/063* (2013.01); *H01J 37/06* (2013.01); *H01J 37/08* (2013.01); *H01J 37/09* (2013.01);
(Continued)

(58) Field of Classification Search
CPC ........ H01J 37/28; H01J 37/08; H01J 37/3174; H01J 37/16; H01J 2237/188; H01J 2237/18; H01J 37/188; H01J 37/18
See application file for complete search history.

(56) References Cited

U.S. PATENT DOCUMENTS

| 6,171,165 B1 | 1/2001 | Kim et al. |
| 6,331,713 B1 | 12/2001 | Smick et al. |

(Continued)

FOREIGN PATENT DOCUMENTS

| EP | 2 096 661 A1 | 9/2009 | |
| EP | 2096661 A1 * | 9/2009 | ............ H01J 37/073 |

(Continued)

OTHER PUBLICATIONS

Extended European Search Report dated May 26, 2011 for European Patent Application No. 10187979.9; 6 total pages.
(Continued)

*Primary Examiner* — Wyatt A Stoffa
(74) *Attorney, Agent, or Firm* — Patterson + Sheridan LLP (57) ABSTRACT

An emitter assembly for emitting a charged particle beam along an optical axis is described. The emitter assembly being housed in a gun chamber and includes an emitter having an emitter tip, wherein the emitter tip is positioned at a first plane perpendicular to the optical axis and wherein the emitter is configured to be biased to a first potential, an extractor having an opening, wherein the opening is positioned at a second plane perpendicular to the optical axis and wherein the extractor is configured to be biased to a second potential, wherein the second plane has a first distance from the first plane of 2.25 mm and above.

19 Claims, 8 Drawing Sheets

(51) Int. Cl.
*H01J 37/08* (2006.01)
*H01J 37/09* (2006.01)
*H01J 37/16* (2006.01)

(52) U.S. Cl.
CPC ..... *H01J 37/16* (2013.01); *H01J 2237/06375* (2013.01)

(56) References Cited

U.S. PATENT DOCUMENTS

| | | | | |
|---|---|---|---|---|
| 6,797,953 | B2* | 9/2004 | Gerlach | B82Y 10/00 315/13.1 |
| 7,465,922 | B1* | 12/2008 | McCord | G01N 23/2251 250/306 |
| 7,557,347 | B2* | 7/2009 | Shojo | H01J 37/153 250/306 |
| 8,173,978 | B2* | 5/2012 | Kim | B82Y 10/00 250/306 |
| 2002/0117967 | A1 | 8/2002 | Gerlach | B82Y 10/00 315/13.1 |
| 2006/0049348 | A1* | 3/2006 | Petrov | G01N 23/2204 250/307 |
| 2007/0051900 | A1* | 3/2007 | Ward | H01J 27/26 250/423 R |
| 2007/0057182 | A1* | 3/2007 | Feuerbaum | G01N 1/32 250/310 |
| 2007/0138388 | A1* | 6/2007 | Ward | H01J 37/08 250/288 |
| 2007/0138404 | A1 | 6/2007 | Frosien et al. | |
| 2007/0158588 | A1* | 7/2007 | Zhou | H01J 37/073 250/492.2 |
| 2007/0215802 | A1* | 9/2007 | Ward | H01J 37/08 250/309 |
| 2007/0221843 | A1* | 9/2007 | Ward | B82Y 10/00 250/309 |
| 2008/0211376 | A1* | 9/2008 | Yasuda | B82Y 10/00 313/414 |
| 2010/0102227 | A1* | 4/2010 | Chen | H01J 37/073 250/311 |
| 2012/0049064 | A1* | 3/2012 | Ren | H01J 37/141 250/310 |
| 2012/0241640 | A1* | 9/2012 | Ward | H01J 37/08 250/396 R |

FOREIGN PATENT DOCUMENTS

| | | |
|---|---|---|
| JP | 60-211753 | 10/1985 |
| JP | 01-260742 | 10/1989 |
| JP | 02-192649 | 7/1990 |
| JP | 03-141543 | 6/1991 |
| JP | 11-185647 | 7/1999 |
| JP | 2006-324119 | 11/2006 |
| JP | 2009-20594 | 9/2009 |
| WO | 2008/084537 A1 | 7/2008 |

OTHER PUBLICATIONS

Japan Office Action dated Jul. 7, 2014 for Application No. 2011-243906; 4 total pages.
Taiwan Office Action dated Aug. 28, 2014 for Application No. 100134821; 7 total pages.

* cited by examiner

SIMPLIFIED PARTICLE EMITTER AND METHOD OF OPERATING THEREOF

CROSS-REFERENCE TO RELATED APPLICATIONS

This application is a continuation of U.S. patent application Ser. No. 12/910,240, filed Oct. 22, 2010, which claims priority to European Patent Application 10187979.9, filed Oct. 19, 2010, which is herein incorporated by reference in its entirety.

FIELD OF THE INVENTION

Embodiments of the invention relate to particle sources for particle beam systems e.g. electron microscopes. Particularly, they relate to simplified particle emitters, charged particle beam devices and methods of operating simplified emitters and charged particle beam devices. More specifically, they relate to an emitter assembly for emitting a charged particle beam along an optical axis, a gun chamber for a charged particle beam device, a charged particle beam device, and a method of operating an emitter assembly or a charged particle beam device, respectively.

BACKGROUND OF THE INVENTION

Technologies such as microelectronics, micromechanics and biotechnology have created a high demand for structuring and probing specimens within the nanometer scale. Micrometer and nanometer scale process control, inspection or structuring, is often done with charged particle beams. Probing or structuring is often performed with charged particle beams which are generated and focused in charged particle beam devices. Examples of charged particle beam devices are electron microscopes, electron beam pattern generators, ion microscopes as well as ion beam pattern generators.

During manufacturing of semiconductor devices or the like, a plurality of observation steps and sample modification steps are usually conducted. Common systems include an electron beam column for observation, imaging, testing or inspecting of a specimen and an ion beam column for patterning of a specimen or material modification.

In light of the increasing desire to improve the resolution of charged particle beam devices, devices with high energy charged particle beams are desired, for example electron beams with 15 keV and above. Thereby, reliable operation at high voltages and simple and robust mechanical design are to be considered. Further, to increase the throughput of charged particle beam devices in applications such as microelectronics, micromechanics and biotechnology, high beam currents and arraying of emitters at a narrow pitch should also be provided.

SUMMARY

In light of the above, an emitter assembly for emitting a charged particle beam along an optical axis according to independent claim 1, a gun chamber for a charged particle beam device according to independent claim 9, a charged particle beam device according to claim 13, and a method of operating an emitter assembly according to independent claim 16 are provided.

According to one embodiment, an emitter assembly for emitting a charged particle beam along an optical axis is provided. The emitter assembly being housed in a gun chamber and includes an emitter having an emitter tip, wherein the emitter tip is positioned at a first plane perpendicular to the optical axis and wherein the emitter is configured to be biased to a first potential, an extractor having an opening, wherein the opening is positioned at a second plane perpendicular to the optical axis and wherein the extractor is configured to be biased to a second potential, wherein the second plane has a first distance from the first plane of 2.25 mm and above.

According to another embodiment a gun chamber for a charged particle beam device is provided. The gun chamber includes an emitter assembly and an electrode having an opening for trespassing of the charged particle beam and being configured to be biased to a third potential. The emitter assembly includes an emitter having an emitter tip, wherein the emitter tip is positioned at a first plane perpendicular to the optical axis and wherein the emitter is configured to be biased to a first potential, an extractor having an opening, wherein the opening is positioned at a second plane perpendicular to the optical axis and wherein the extractor is configured to be biased to a second potential, wherein the second plane has a first distance from the first plane of 2.25 mm and above.

According to a yet further embodiment, a charged particle beam device is provided. The charged particle beam device includes one or more, typically at least two emitter assemblies. Each of the one or more emitter assemblies includes an emitter having an emitter tip, wherein the emitter tip is positioned at a first plane perpendicular to the optical axis and wherein the emitter is configured to be biased to a first potential, an extractor having an opening, wherein the opening is positioned at a second plane perpendicular to the optical axis and wherein the extractor is configured to be biased to a second potential, wherein the second plane has a first distance from the first plane of 2.25 mm and above. Thereby, each of the emitters is connected to one power supply for providing the first potential to the one or more emitters.

According to an even further embodiment, a method of operating an emitter assembly is provided. The method includes emitting a charged particle beam along an optical axis, biasing an emitter to a first potential, and biasing an extractor to a second potential, wherein the voltage between the first potential and the second potential is at least 15 kV, particularly at least 20 kV.

Further advantages, features, aspects and details that can be combined with embodiments described herein are evident from the depending claims, the description and the drawings.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE INVENTION

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the charged particle beam device or components thereof will exemplarily be referred to as a charged particle beam device including the detection of secondary electrons. The present invention can still be applied for apparatuses and components detecting corpuscles such as secondary and/or backscattered charged particles in the form of electrons or ions, photons, X-rays or other signals in order to obtain a specimen image.

Generally, when referring to corpuscles it is to be understood as a light signal in which the corpuscles are photons as well as particles, in which the corpuscles are ions, atoms, electrons or other particles.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as masks, glass substrates, memory disks or the like.

According to embodiments described herein, a simplified emitter assembly for emitting a charged particle beam along the optical axis is provided. For example, a simplified electron emitter, such as the cold field emitter or thermal field emitter can be provided. This is particularly relevant for applications having a high energy electron beam within the charged particle beam device. According to the following description, reference is made to electron beam devices. However, it is to be understood that corresponding principles can also be applied for other charged particle beam devices, such as ion microscopes.

According to typical embodiments, the emitter assembly, the gun chamber and the charged particle beam device can be used for field emitters, such as cold field emitters and thermal field emitters, i.e. emitters having a high brightness, for example above $1\times10^8$ A/(cm$^2$ sr). For example common hairpin cathodes can have a brightness of $5\times10^4$ to $5\times10^6$ A/(cm$^2$ sr), Emitter tips of LaB6 could typically have a brightness of a few $1\times10^7$ A/(cm$^2$ sr), whereas field emitters can have a brightness of $1\times10^8$ A/(cm$^2$ sr) and above or even $1\times10^9$ A/(cm$^2$ sr) and above.

Figure 1:
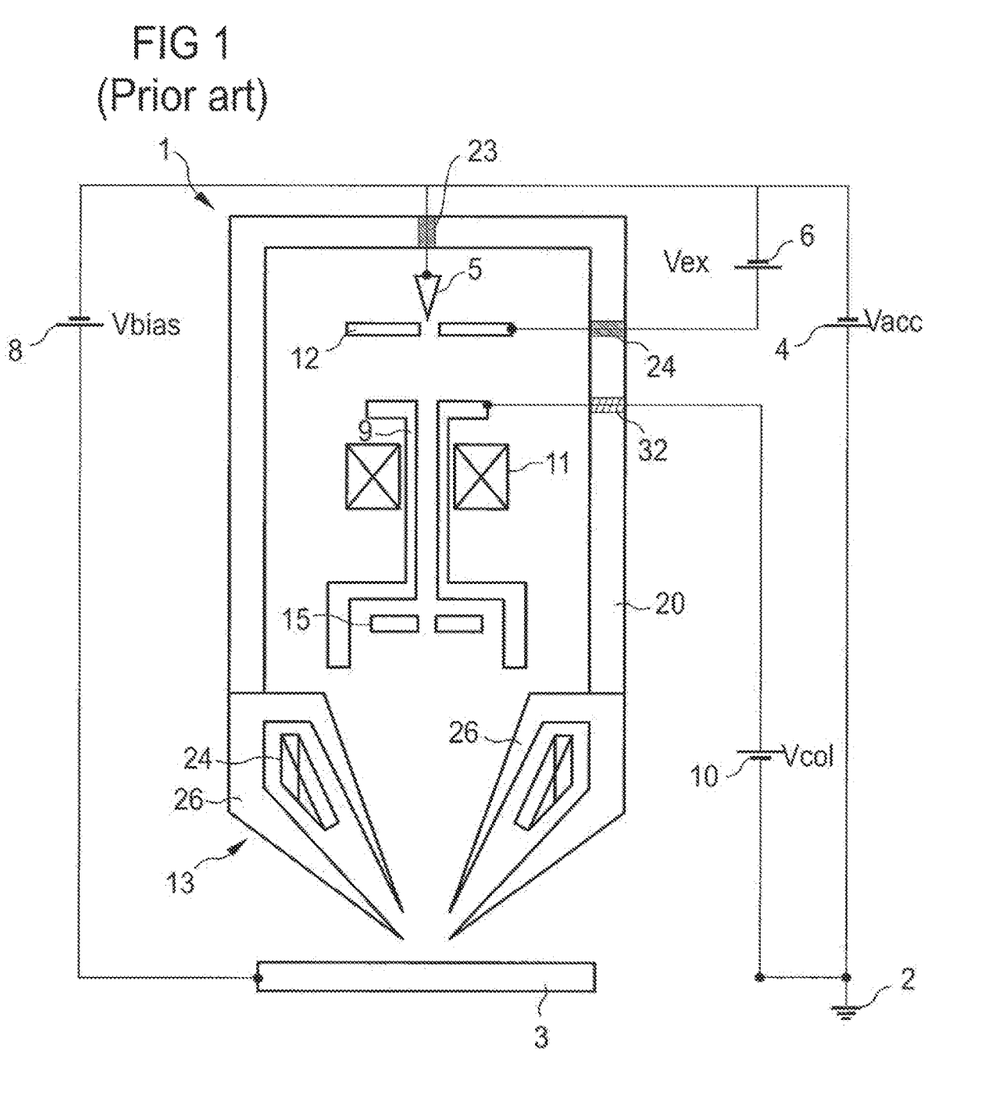
FIG. 1 shows a schematic view of a charged particle beam device with a common emitter assembly.

FIG. 1 shows an electron beam device 1 having a housing 20 and an objective lens 13. An electron emitter 5 includes an emitter tip opposite to an extraction electrode 12, which is positively biased (for the example of electrons) to an extraction voltage Vex. In order to provide the extraction voltage, power supply 6 is connected to the extraction electrode 12. The assembly of the emitter 5 and the extraction electrode is connected with the power supply for providing the acceleration voltage Vacc, which can typically be connected to ground. This is indicated by reference numeral 2. Thus, the acceleration voltage determines the beam energy of electrons that are travelling in regions of the charged particle beam device 1 that are on ground potential or when hitting a grounded target. According to some examples, as shown in FIG. 1, the landing energy of electrons emitted by the emitter 5 on the specimen 3 can be defined by biasing the specimen 3. Thereby, the voltage supply 8 can typically be connected to a portion of the charged particle beam device which is biased on the acceleration potential or the acceleration voltage. Thereby, the landing energy of the electron beam can be adjusted or determined by the power supply 8. According to yet further options, which can be used for embodiments of the invention described herein, the beam energy within the charged particle beam device can further be varied, typically increased, by applying a voltage Vcol to internal beam guiding components 9 in the charged particle beam device 1. Accordingly, the power supply 10 can be connected to ground and the beam guiding components 9.

According to typical examples, the emitter is biased to the acceleration potential provided by the power supply 4. Thereby, the power supply 4 can be connected to ground (reference numeral 2) and the high-voltage is provided into the chamber 20 through the high-voltage feedthrough 23. A further high-voltage, which is provided by the acceleration voltage and the extraction voltage, i.e. by the power supply 4 and the power supply 6, is fed in the chamber through high-voltage feedthrough 24, in order to connect the extraction electrode 12 with the respective conductor. Further, the voltage feedthrough 32 is provided in order to connect the beam guiding components 9 with the potential provided by the power supply 10.

Due to the acceleration voltage and the extraction voltage, an electron beam is emitted by the emitter 5 and guided along the optical axis within the charged particle beam device 1. The charged particle beam can then be focused by condenser lens 11 and objective lens 13 to be focused on the specimen 3. Typically, the objective lens 13 includes upper and lower pole pieces 26 and a coil 24. The energy of the electron beam on the specimen 3 can be adjusted by the power supply 8, which can adjust or provide the landing energy since the power supply 8 is connected to the acceleration voltage Vacc and defines the potential difference between the emitter tip 5 and the specimen 3. On impingement of the primary electron beam, which is emitted from the emitter, secondary and/or backscattered particles are generated which can be detected with detector 15. In order to provide an image of a region of the specimen, scanning devices (not shown in FIG. 1) can be provided to scan the electron beam over the desired region of the specimen.

Common emitter assemblies follow the emitter manufacturer's recommendations and datasheets and attempt to maintain the voltage between the emitter tip and the extraction potential constant as well as the tip to extractor at a constant distance. This is generally done independent of the acceleration voltage Vacc, which may vary between some ten kV to some hundred kV. Thereby, two different designs are mostly used. First, the tip is carried by an elongated emitter insulator. The emitter insulator is a high-voltage feedthrough capable of withstanding the required acceleration voltage and is also used for supplying the high voltage to the emitter tip. The extractor is carried by a different extractor insulator, which is attached to the vacuum chamber, for example a grounded vacuum chamber. Thereby, the extractor voltage is fed through an additional high-voltage feedthrough capable of withstanding essentially the same acceleration voltage, i.e. the acceleration voltage minus the extraction voltage. Secondly, the approach of the mini module can be used. Thereby, the extractor is mechanically fixed to the structure carrying the emitter. Accordingly, the extractor insulator needs to withstand the comparably small extraction voltage Vex. However, the additional extraction voltage needs to be fed through the same emitter insulator, which may result in arcing. This mini module design needs only one high-voltage feedthrough. If the mini module itself is well aligned internally, the emitter and the extractor electric electrode can be aligned together with respect to the following electrode, such as an anode.

Figure 2A:
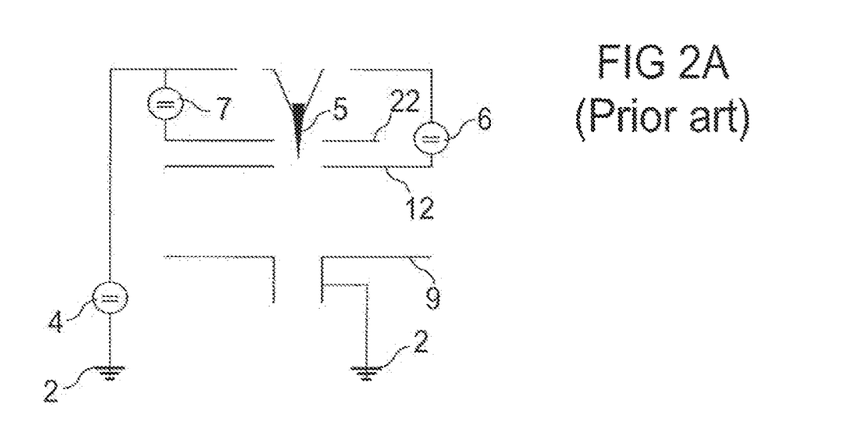
FIG. 2A illustrates a common emitter assembly and the method of operation thereof.

Both designs can also be described with respect to FIG. 2A. In FIG. 2A the acceleration voltage is provided to the tip of the emitter 5 by the power supply 4. The power supply 7 provides a suppressor voltage to the suppressor electrode 22 and the power supply 6 provides the extraction voltage to the extraction electrode 12. The further electrode 9 can, for example, be set on ground potential or to another potential of a few kV. For example, the further electrode 9 can be an anode, a first electrode of a condenser lens, an electrode of a beam guiding component for guiding the beam on a higher potential through the column, or the like.

According to typical optional modification, the suppressor can for example be in a range of −100 V to −500 V as compared to the emitter tip. Thereby, the suppressor is used to suppress thermal emission of the emitter tip.

In the case of the two above-described designs, the tip can, for example, be on −30 kV the suppressor can be on −30.3 kV, the extraction electrode 12 can be on −22 kV and the further electrode 9 can be on ground. Thus, a large potential difference is created between the extractor aperture and the first electrode. This voltage drop creates a parasitic lens, which is difficult to control because usually there are no alignment elements. Typically, the tip should be close to the condenser lens, which results in the lack of space for alignment elements, and additional elements would make it even more difficult to reliably withstand large voltage drops across the gap. Further, if the voltage drop between the extractor and ground will be several ten kV, such as 22 kV according to the above example, the corresponding field will produce a strong 'parasitic' lens and provide many opportunities for high voltage flashover. This can be avoided by the simplified emitter assembly according to embodiments described below. Accordingly, even if the tip of emitter 5 can be aligned with respect to the extractor the lens, a parasitic lens between the extractor electrode 12 and the further electrode 9, can often not be aligned. Further, this design requires two or more high-voltage feedthroughs. For the mini module design, it would be possible to align the emitter 5 together with the extraction electrode 12 with respect to the further electrode 9. However, this does require a very good alignment between the emitter 5 and the extraction electrode 12 and still generates strong lens between the extraction electrode 12 and the further electrode 9.

Figure 2B:
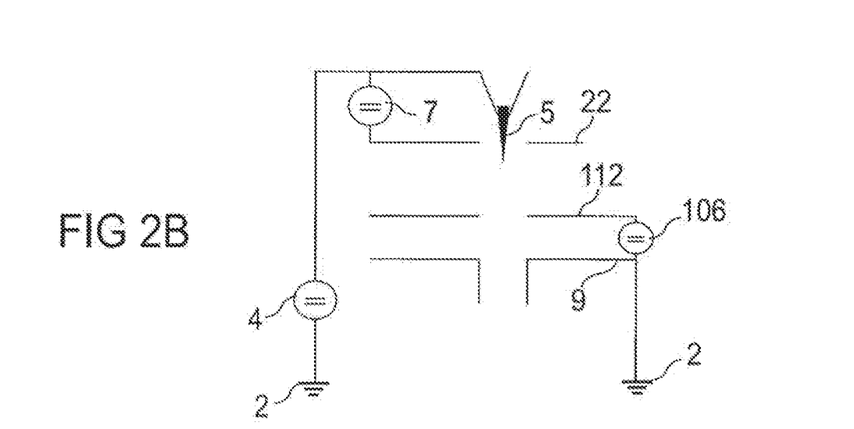
FIG. 2B illustrates an emitter assembly according to embodiments described herein and the method of operation thereof.

The new concept, according to embodiments described herein, overcomes a technical prejudice such that it is not necessary and not even advisable to operate an emitter according to the mechanical setup used by the emitter vendors, which is used to qualify the emitter performance and the production of data sheets. The principal set up is shown in FIG. 2B. In FIG. 2B the acceleration voltage is provided to the tip of the emitter 5 by the power supply 4. The power supply 7 provides a suppressor voltage to the suppressor electrode 22. The extraction electrode 112 is at a low voltage, which can be similar or close to the voltage of the further electrode 9. Thus, a power supply 106 can provide a relatively small control voltage for the extraction electrode 112. The further electrode 9 for example, can be set on ground potential or to another potential of a few kV. According to typical embodiments, which can be combined with other embodiments described herein, the further electrode 9 can be an anode, a first electrode of a condenser lens, an electrode of a beam guiding component for guiding the beam on a higher potential through the column, or the like.

In the case of the two above-described designs, the tip can, for example, be on −30 kV and the suppressor can be on −30.3 kV, the extraction electrode 112 can be on −5 kV and the further electrode 9 can be on ground. Thus, the large potential difference which has been created between the extractor aperture and the first electrode (see FIG. 2A) is significantly reduced. The resulting parasitic lens is also reduced.

Accordingly, the extraction electrode 112 is positioned at a larger distance from the tip of the emitter 5. According to typical embodiments which can be combined with other embodiments described herein, this distance can be at least 2.25 mm, at least 2.5 mm, at least 5 mm or even in the range of 7 mm to 20 mm. Further, the potential of the extraction electrode 112 can be, e.g. for the example shown in FIG. 2B, in a range of ground to about 10 kV, typically it can be 2 kV to 7 kV. Accordingly, the influence of the parasitic lens between the extraction electrode 112 and the further electrode 9 can be significantly reduced. As described herein, the tip-to-extractor spacing can be enlarged as long as the extraction voltage, i.e. the potential difference between the tip of the emitter 5 and the extraction electrode 112 is raised accordingly. Thereby, the field strengths of the electric field at the emitter apex can be provided as desired, i.e., can be kept essentially constant as compared to common emitter assembly configurations.

It is to be understood that even though examples of potentials are described herein, embodiments of the invention are also directed to examples where other potentials are used as long as the relative potentials of the components, i.e. the potential differences or voltages, are within the described ranges. For example, the tip of the emitter, the specimen or another component can be on ground and the remaining components can be raised to positive potentials or to another potential, respectively.

Yet according to some embodiments described herein, the beam guiding components in the column can be biased to ground potential. This can be in particular used for high speed scanning and detection, for example for electron beam inspection system (EBI). If the column itself is set on ground potential, there is no need to keep elements such as electrostatic scan deflectors or detection electronics on a floating, high potential, which could result in noise in scanning or detection signals from partial discharge. Yet according to other options the column might as well be at high potentials, e.g. for critical dimension measuring applications, where the specimen should be on ground. However, also for such applications, the relative potentials from the tip to the extractor and the extractor to a further electrode can be advantageously utilized.

Figure 3:
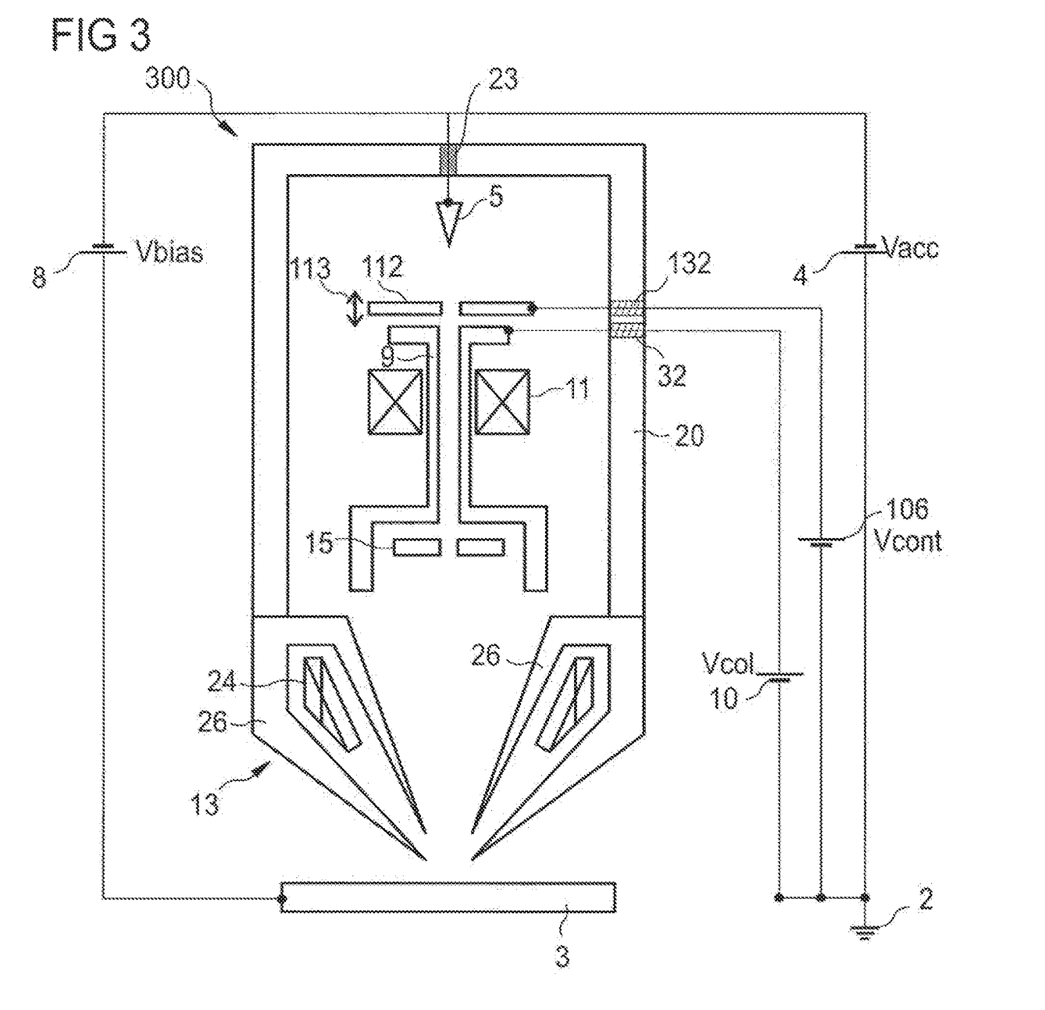
FIG. 3 shows a schematic view of a charged particle beam device with an emitter assembly according to embodiments described herein.

FIG. 3 shows an electron beam device 300 illustrating embodiments described herein. The electron beam device 300 has a housing 20 and an objective lens 13. An electron emitter 5 includes an emitter tip opposite to an extraction electrode 112, which is positively biased compared to the tip to a voltage for extracting the electrons. However, as compared to FIG. 1, in order to extract the electrons, a comparable small voltage is provided by control power supply 106, which is connected to the extraction electrode 112. The power supply 4 for providing the acceleration voltage Vacc, which can typically be connected to ground (reference numeral 2) determines the beam energy of electrons that have been travelling in regions of the charged particle beam device 300 that are on ground potential or when hitting a grounded target. According to some embodiments, which can be combined with other embodiments described herein, as shown in FIG. 3, the landing energy of electrons emitted by the emitter 5 on the specimen 3 can be defined by biasing the specimen 3. Thereby, typically the voltage supply 8 can be connected to a portion of the charged particle beam device which is biased on the acceleration potential/voltage. Thereby, the landing energy of the electron beam can be adjusted or determined by the power supply 8. According to yet further options, which can be used for embodiments of the invention described herein, the beam energy within the charged particle beam device can be varied further, typically increased, by applying a voltage Vcol to internal beam guiding components 9 or a first electrode 9 in the charged particle beam device 300. Accordingly, the power supply 10 can be connected to ground and the beam guiding components 9.

According to typical examples, the emitter is biased to the acceleration potential provided by the power supply 4. Thereby, the power supply 4 can be connected to ground (reference numeral 2) and the high-voltage is provided into the chamber 20 through the high-voltage feedthrough 23. A further high-voltage feedthrough can be avoided. The control voltage of the power supply 106, can be fed in the chamber through low-voltage feedthrough 132, in order to connect the extraction electrode 112 with the respective conductor. Further, the voltage feedthrough 32 is provided in order to connect the beam guiding components 9 with the potential provided by the power supply 10. Thereby, typically high voltage feedthroughs are configured to withstand voltages of 20 kV and above, whereas low-voltage feedthroughs are configured for voltages of 15 kV or below, even though they can also withstand higher voltages, Due to the acceleration voltage and the extraction voltage, an electron beam is emitted by the emitter 5 and guided along the optical axis within the charged particle beam device 1. The charged particle beam can then be focused by condenser lens 11 and objective lens 13 on the specimen 3. Typically, the objective lens 13 includes upper and lower pole pieces 26 and a coil 24. The energy of the electron beam on the specimen 3 can be adjusted by the power supply 8, which can adjust or provide the landing energy since the power supply 8 is connected to the acceleration voltage Vacc and defines the potential difference between the emitter tip 5 and the specimen 3. On impingement of the primary electron beam, which is emitted from the emitter, secondary and/or backscattered particles are generated which can be detected with detector 15. In order to provide an image of a region of the specimen, scanning devices (not shown in FIG. 3) can be provided to scan the electron beam over the desired region of the specimen.

As shown in FIG. 2B and FIG. 3, the voltage between the tip of the emitter 5 and the extraction electrode 112 is raised. Even though raising a critical voltage may not be considered one first sight, an increase of the voltage between the emitter and the extraction electrode can be beneficial, particularly if the acceleration voltage of the emitter tip is raised and/or if a charged particle beam device with a high beam energy inside the column is considered. Thereby, it is to be understood that a charged particle beam device with a high charged particle beam energy has a significantly higher beam energy within guiding components of the column as compared to the landing energy of the charged particles. For example, the beam energy within the column can be at least 20 times, or at least 30 times higher compared to the landing energy of the charged particles.

Figure 4:
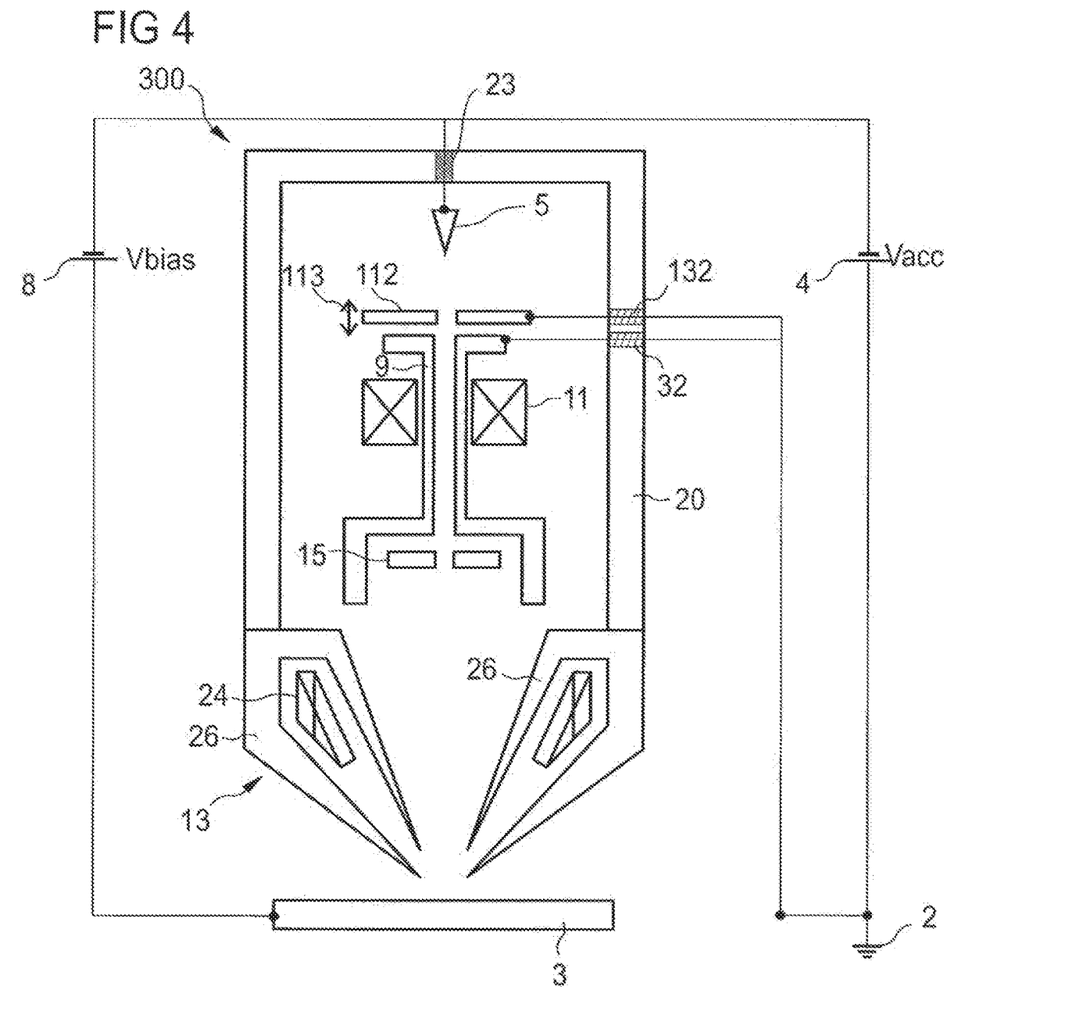
FIG. 4 shows a schematic view of a yet further charged particle beam device according to embodiments described herein utilizing an emitter assembly according to embodiments described herein.

As shown in FIG. 4, the tip-to-extractor distance can be increased such that the voltage between the tip of emitter 5 and the extraction electrode is increased up to the acceleration voltage, for example 30 kV in the example shown above. Thereby, as shown in FIG. 4, the extraction voltage and the further electrode 9 or the beam guiding components 9 in the column can be set to ground potential. Accordingly, the full voltage drop is between the tip and the extractor. Nevertheless, in light of the increased distance, the field strengths of the electric field at the emitter apex can be provided as desired. Further, the field strengths between mechanical components of the tip carrier and the extractor carrier can be reduced by also properly increasing the corresponding distances. Accordingly, in some embodiments there is no need for a high-voltage power supply for the extraction voltage or even for any power supply for the extraction voltage. For example, the first electrode of the condenser lens, an anode or the like, can be considered as the extractor for the emitter. Thus, in the example shown in FIG. 4, the extraction electrode could also be omitted by positioning the guiding components 9 at the position of the extraction electrode 112. Nevertheless, even if internal column components such as an anode, a first electrode of a condenser lens, or beam guiding components for providing high energy beams within the column are raised to Vcol, the parasitic lens can be reduced. Further, if no separate isolated extractor electrode and no Vex power supply are provided, the emission from the tip can be simply controlled by Vacc and/or the tip-to-extractor distance.

Since an omission of a power supply for the extraction electrode might result in loss of flexibility of control parameters during operation of the electron beam device, the extraction electrode might be movable along the optical axis as indicated by arrow 113 in FIG. 4. However, even though an emitter is usually operated at nearly the same operating conditions over its entire lifetime, minor changes in the extraction voltage, i.e. the voltage between the emitter tip and the extraction electrode can be necessary to compensate for aging effects. These changes are usually less than 10% to 15% of the extraction voltage. This can be compensated by adjusting the tip to extraction electrode distance and/or by providing a relatively small voltage, such as the control voltage provided by power supply 106 in FIG. 3. Within FIG. 3 the movement of the extraction electrode along the optical axis is also indicated by reference 113. However, if for example a control voltage is connected to the extraction electrode 112, the movement, as shown by arrow 113, can be considered optional. According to typical embodiments, if aging effects of the voltage between the emitter tip and that extraction electrode are to be compensated for, it is sufficient to provide a voltage of, for example, 1 kV to 6 kV, such as 3 kV to 4.5 kV to the extractor electrode. According to typical embodiments, which can be combined with other embodiments described herein, the control voltage supply can typically vary the voltage between the tip and the extractor by 10% to 15%. If, for example, this voltage is reference to ground, the necessary insulator can be relatively simple structure and the feedthrough can be made reliable and off-the-shelf.

According to further embodiments, which can be combined with other embodiments described herein, the power supply for connecting the extraction voltage can be forced to be unipolar by choosing the tip to extractor spacing, such that the aging effects can be compensated for by using one polarity of the voltage supply only. According to yet further alternative options, aging effects could also be compensated for by static adjustment of the position of the extraction electrode along the optical axis, for example, by using shims during a maintenance procedure.

Figure 5:
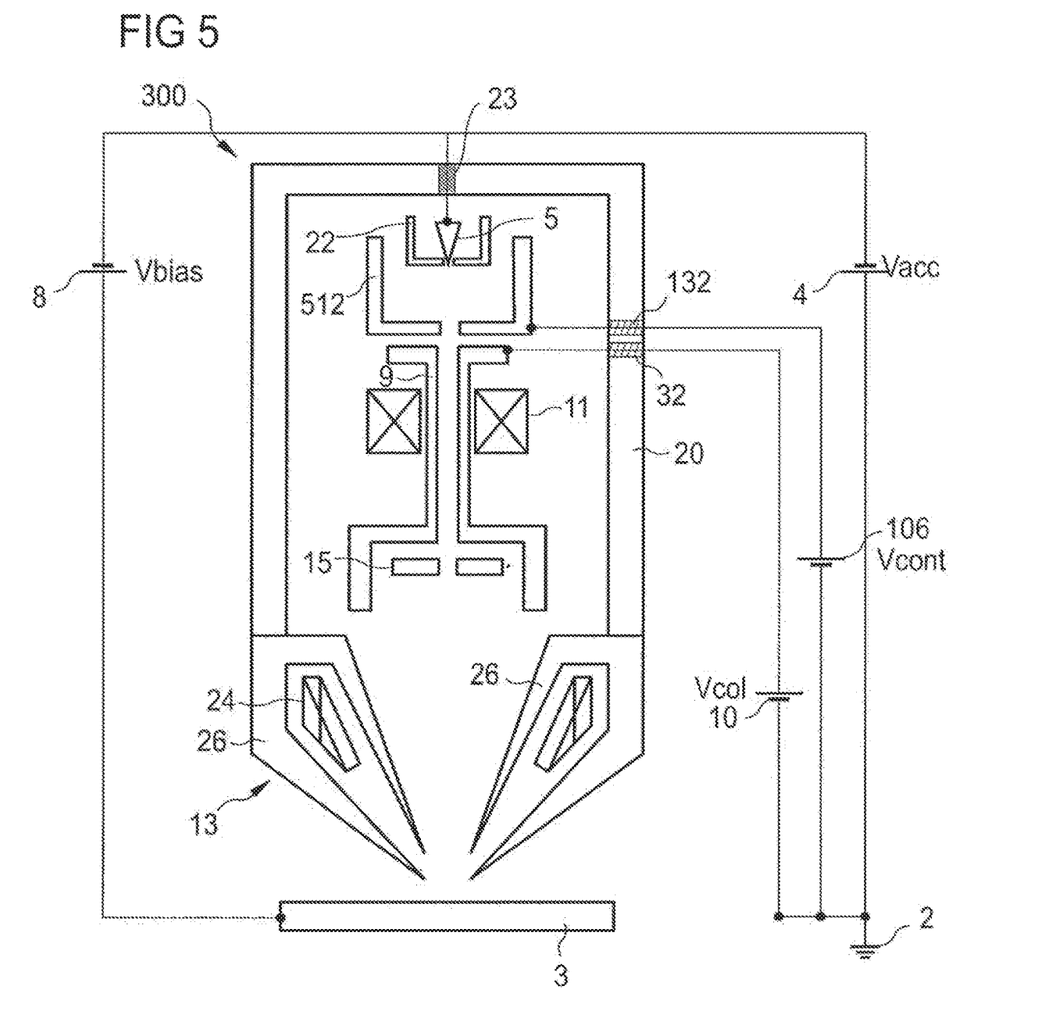
FIG. 5 shows a schematic view of a charged particle beam device with a yet further emitter assembly according to embodiments described herein.

Further embodiments can be described with reference to FIG. 5. Therein, a further electron beam device 300 is described. Similar to FIG. 3, the electron beam device 300 has a housing 20 and an objective lens 13. An electron emitter 5 includes an emitter tip opposite to an extraction electrode 512, which is positively biased compared to the tip to a voltage for extracting the electrons. A suppressor 22, such as a suppressor cup, is provided for suppressing thermal emission of the tip. Thereby, the tip of the emitter extends above 0 mm to 0.5 mm, e.g. 0.25 mm below the opening aperture in the suppressor. The power supply 4 for providing the acceleration voltage Vacc, which can typically be connected to ground (reference numeral 2) determines the beam energy of electrons that are travelling in regions of the charged particle beam device 300 that are on ground potential. The landing energy of electrons emitted by the emitter 5 on the specimen 3 can be defined by biasing the specimen 3. Thereby, typically the voltage supply 8 can be connected to a portion of the charged particle beam device which is biased on the acceleration potential/voltage. The beam energy within the charged particle beam device can be varied further, typically increased, by applying a voltage Vcol to internal beam guiding components 9 or a first electrode 9 in the charged particle beam device 300. The power supply 4 can be connected to ground (reference numeral 2) and the high-voltage is provided into the chamber 20 through the high-voltage feedthrough 23. A further high-voltage can be avoided. The control voltage of the power supply 106 can be fed in the chamber through low-voltage feedthrough 132, in order to connect the extraction electrode 112 with the respective conductor. Further, the voltage feedthrough 32 is provided in order to connect the beam guiding components 9 with the potential provided by the power supply 10. Due to the acceleration voltage and the extraction voltage, an electron beam is emitted by the emitter 5 and guided along the optical axis within the charged particle beam device 300. The charged particle beam can then be focused by condenser lens 11 and objective lens 13 on the specimen 3. Typically, the objective lens 13 includes upper and lower pole pieces 26 and a coil 24.

The suppressor is typically biased to about −100 V to about −1 kV with respect to the emitter tip. The energy of the electron beam on the specimen 3 can be adjusted by the power supply 8, which can adjust or provide the landing energy since the power supply 8 is connected to the acceleration voltage Vacc and defines the potential difference between the emitter tip 5 and the specimen 3. On impingement of the primary electron beam, which is emitted from the emitter, secondary and/or backscattered particles are generated which can be detected with detector 15. In order to provide an image of a region of the specimen, scanning devices (not shown in FIG. 3) can be provided to scan the electron beam over the desired region of the specimen.

As described above, the extraction electrode is positioned along the optical axis such that the distance between the emitter tip and the extraction electrode aperture, i.e. the opening in the extraction electrode, is at least 2.25 mm, at least 4.5 mm, e.g. in the range of 4 to 10 mm. The control voltage provided by power supply 106 is such that aging effects of the emitter assembly can be compensated for. According to yet further additional or alternative modification, a compensation of the extraction voltage or an adjustment of the field strength at the emitter tip can also be provided by the potential applied to the suppressor. For example, if the suppressor is typically biased to −300 V as compared to the tip, which is about the manufacturer recommendation, a higher suppressor voltage such as about −600 V to −800 V as compared to the tip can be used to compensate for one kV to a few kV of a tip to extractor voltage. Thus, aging effects or fine adjustment of the tip-to-extractor voltage can be conducted by one or more of the elements selected from the group consisting of: the control voltage or the respective power supply, the suppressor voltage or the respective power supply, a movement of the tip to vary the extractor-tip-distance, and a movement of the extractor to vary the extractor-tip-distance.

According to yet further additional or alternative modifications of embodiments of methods and apparatuses described herein, the extractor electrode can be mechanically and electrically connected to the housing of the gun chamber or the charged particle beam device. Thereby, if, for example, the housing is grounded, the extractor is grounded as well. Thereby, typically, aging effects of the tip can be compensated for, or adjustment of the field strength at the tip can be provided by adjusting the voltage of the suppressor. According to typical embodiments a change of the suppressor potential by about 500 V to 1000 V equals a change of the tip-to-extractor voltage of about 20% to 40%. This is independent of the acceleration voltage. Thus, if an acceleration voltage of about 10 kV would be used for a system with a beam energy in the column of 10 keV, an increase of the suppressor voltage of e.g. 700 V would compensate for, e.g., about 3 kV tip-to-extractor voltage, and if an acceleration voltage of about 30 kV would be used for a system with a beam energy in the column of 30 keV, an increase of the suppressor voltage of e.g. 700 V would compensate for, e.g., about 10 kV tip-to-extractor voltage. Thus, the suppressor voltage is a beneficial compensation tool, because it can efficiently be used in the same way as tip-to-extractor voltages variations, because it compensates for a percentage of the tip-to-extractor voltage.

In light thereof, a combination of a variable tip-to-extractor distance, e.g., by moving the emitter, and of a suppressor voltage variations can provide a good adjustment. Particularly the option of setting the extractor on the housing potential or the potential of internal beam guiding elements provides for these correction parameters also a further simplified design.

According to yet further embodiments, which can be combined with other embodiments described herein, the above described influence of the suppressor voltage can also be used for control of the beam current. Since the same current change would be achieved with an essentially constant change of the suppressor voltage independent of the beam energy within the column, no excessive suppressor voltages would be required even for systems having beam energies in the columns for 25 kV and above. Yet, on the other hand, a correction of the beam current with the tip-to-extractor voltage would be essentially proportional to tip-to-extractor voltage. Thus, for the embodiments having an increased tip-to-extractor voltage described herein, a current adjustment would also require an increased voltage range for adjustment.

Yet according to some embodiments described herein, which can be combined with other embodiments described herein, an acceleration of the electrons within the column can be provided to a major part, e.g. at least 70% or least 80%, between the tip and the extraction electrode. Thus, even for high energy beam devices, which have a high energy electron beam guiding region and/or which have at least 10 times higher beam energy in the column compared to the landing energy, an acceleration takes place mainly between the tip and the extractor. Thereby, it should be noted that the earlier the charged particles are accelerated to the high energy, the more energy broadening effects and aberrations due to electron-electron interaction can be reduced. Since the emitted electrons are immediately accelerated to essentially their maximum energy across the smallest possible distance, electron-electron interaction is reduced to the absolute minimum. This reduces energy broadening and limits the increase in virtual source size.

According to yet further embodiments, the following feature can be provided as an advantageous option for a mechanical design providing a simplification regarding High Voltage stability. The extractor structure or extraction electrode can be shaped like a cup that surrounds the emitter structure. Thereby, the extractor electrode 512 has a portion, which is essentially perpendicular to the optical axis and including the extractor aperture or opening. Further, the extractor electrode 512 has a rim portion surrounding the optical axis, and particularly a region of the emitter tip, which is biased to the high acceleration potential. Thereby, the cup can be shaped to have a sufficient distance to the emitter in order to avoid arcing. If for example the emitter and/or the holding structure of the emitter tip has a small radius of curvature in some region, the cup can be shaped to reduce the risk of arcing in this region. If a cup-shaped extractor electrode 512 is provided, the volume of high field strength is confined to the gap between the extractor cup and the emitter and can be easily controlled by proper shaping and machining of the parts. The potentially dangerous voltage drop along the emitter insulator is mainly handled by making the insulator sufficiently long and by proper surface design. Since the extractor cup is basically at ground potential, all components of the emitter assembly, all components of a gun chamber, and/or all components of the charged particle beam device are outside of the shield region and the vacuum chamber is in an area of low field strength which simplifies the mechanical design and reduces the risk of arcing significantly. This design allows reducing the distance between virtual source and condenser lens. This automatically leads to better optical performance.

According to yet further optional modifications of embodiments described herein, the extractor electrode or the extractor cup can be mechanically centered to the condenser lens. Since the extractor cup is to be biased to a relatively low potential, i.e. there is a relatively smaller voltage between the housing 20 and the extractor electrode 512, this alignment can be more easily accomplished. A mechanical x-y-alignment of the tip with respect to the extractor allows bringing the beam to the optical axis of the condenser. This improved mechanical alignment leads to improved optical performance.

Figure 6:
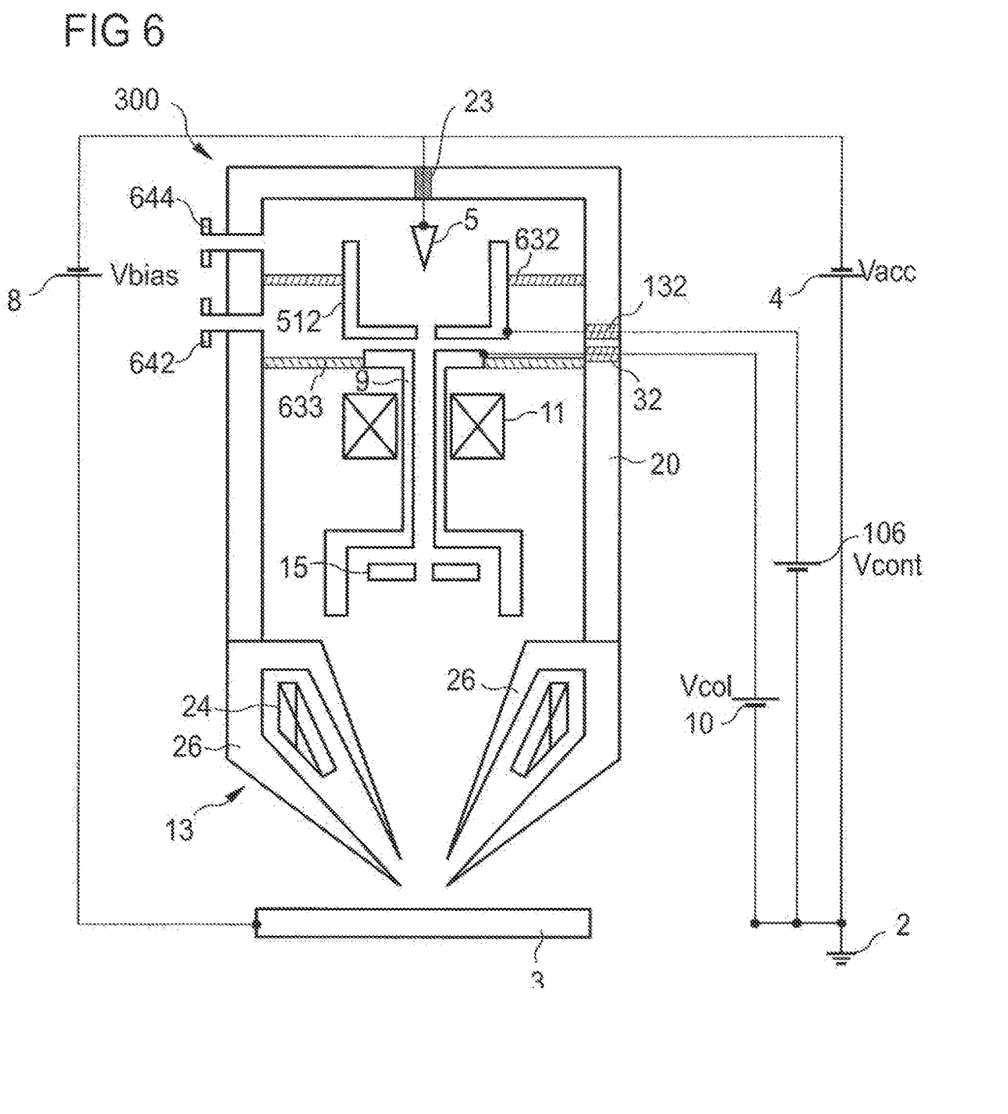
FIG. 6 shows a schematic view of another charged particle beam device according to embodiments described herein utilizing another emitter assembly according to embodiments described herein.

FIG. 6 illustrates a further advantageous modification, which can be provided in light of the simplified design of the emitter assembly. As compared to the embodiments shown in FIGS. 3 to 5, the electron beam device 300 shown in FIG. 6 shows the insulator 632 for carrying the extractor 512 and shows the insulator 633 carrying the further electrode 9 or the beam guiding components 9. The extractor electrode, the insulators and the further electrodes are formed to provide two sub-chambers in the gun chamber region. A first connection 644 for a vacuum pump and a second connection 642 for a vacuum pump are provided.

Thus, having the emitter tip and the region between the extractor and the further electrode independent of each other, it is possible to evacuate the region of the emitter 5. This is inter alia more easily possible since the regions outside the cup are shielded by the potential of the extractor 512, which can be essentially ground (+− a few kV) or essentially the potential of the housing or the beam guiding components (+− a few kV). Accordingly, the proposed design allows easy adaptation to emitters with special vacuum requirements like a lower total pressure (e.g. in the order of magnitude of $1\times10^{-11}$ mbar), lower partial pressure of critical gases (e.g. in the order of magnitude of $1\times10^{-9}$ mbar) or even higher partial pressure of process gases (e.g. in the order of magnitude of $1\times10^{-6}$ mbar). In common systems, this would usually require inserting an additional differentially pumped vacuum area between condenser and emitter, accompanied by a significant increase in tip-to-condenser distance.

According to the embodiments described herein, the extractor can be used as the differential pumping aperture and separate the volumes below and above the extractor cup by introducing an insulating barrier between the extractor cup and the vacuum chamber housing. Since the voltage applied to the extractor cup is small, there is no risk of arcing.

Figure 7:
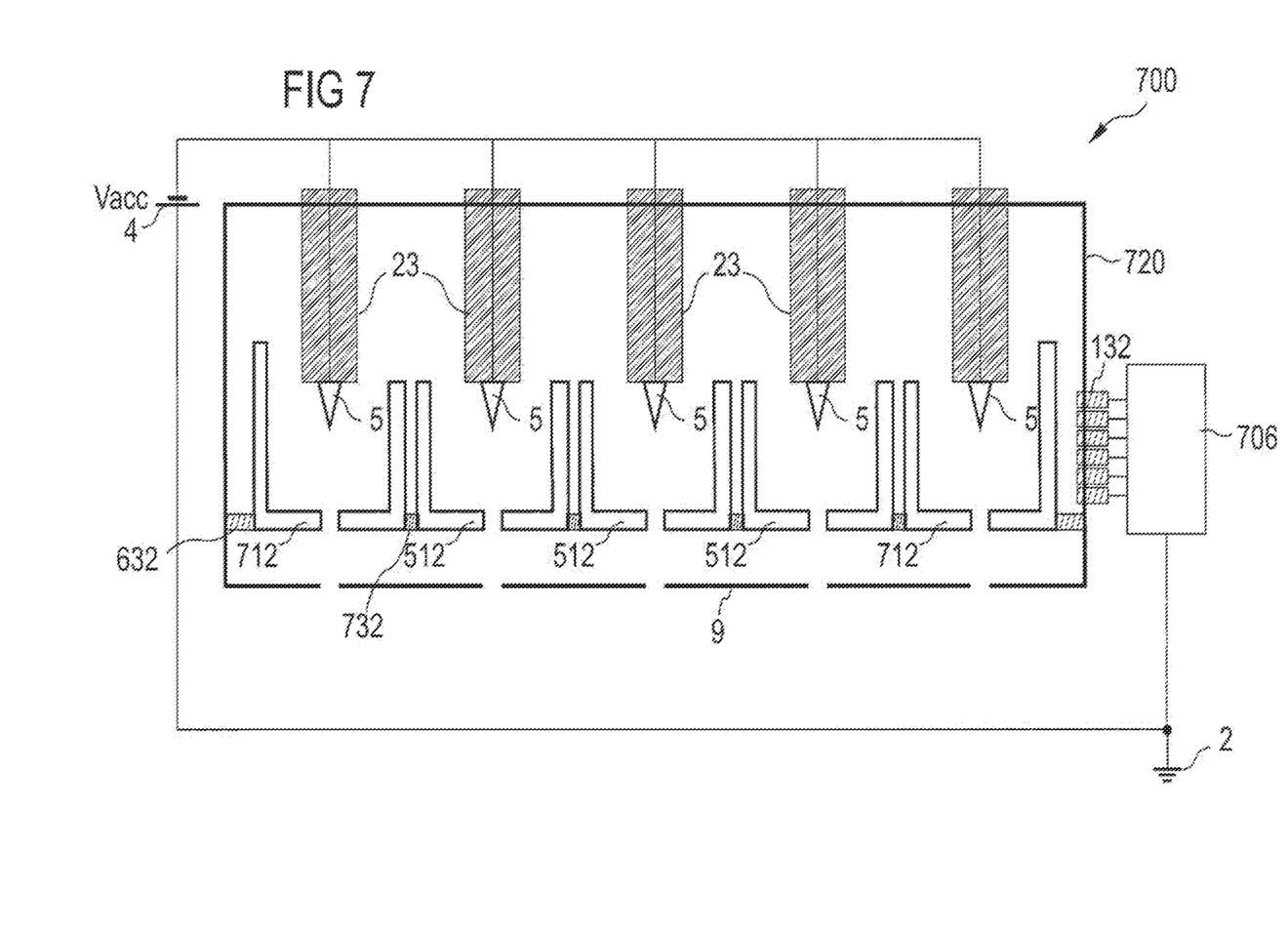
FIG. 7 shows a schematic view of a multi-beam gun chamber area according to embodiments described herein having a plurality of emitter assemblies according to embodiments described herein.

According to another embodiment, the simplified emitter assembly can be advantageously used for a charged particle multi-beam device, wherein a plurality of emitter tips is arrayed. FIG. 7 shows a gun region of a multi-beam system. The system 700 includes a housing portion 720 and two or more high voltage feedthroughs 23 (5 insulating feedthroughs are shown in FIG. 7) for the acceleration voltage provided by power supply 4. The acceleration voltage is provided to two or more emitters 5 having respective emitter tips. Two or more, i.e. a corresponding number, extractor electrodes 512/712 or extractor cups are provided. According to the example shown in FIG. 7, two or more low-voltage feedthroughs 132 can be provided to allow for biasing each of the two or more extractors to an individual potential. This is indicated by one power supply 706 having a corresponding number of outputs (5 in FIG. 7). According to alternatives, each control voltage for an extractor electrode can be provided by an individual power supply or a smaller number of power supplies can each provide some of the required potentials. The further electrode, i.e. an electrode in beam travelling direction downstream of the extractor is shown in FIG. 7 by reference numeral 9. For example, the further electrode 9 can be an anode, a first electrode of a condenser lens, a beam guiding component for providing high beam energies, or the like.

As described above a combination of a variable tip-to-extractor distance, e.g., by moving the emitter, and of a suppressor voltage variations can provide a good adjustment for the beam current and/or a good compensation of tip aging equally usable to a variation of the tip-to-extractor voltage. Particularly the option to set the extractor on the housing potential or the potential of internal beam guiding elements provides for these correction parameters also a further simplified design, i.e. the power supply 706, the feedthroughs 132 and the insulators 632, 732 could be omitted. A control of the individual beams and/or a compensation of the aging of the emitter could be controlled by one or, preferably, both of the tip-to-extractor distance and the suppressor voltage. Thus, a multi-beam device can be provided such that equal currents for all emitters can be adjusted and aging of the emitters can be compensated. The equal current and the option to compensated for aging can then be provided with a simplified design allowing for a particularly narrow pitch, e.g. 50 mm or smaller, between the emitters as disclosed herein.

Generally, the simplified emitter assembly according to embodiments described herein, allows for arraying of many emitters at a narrow pitch, e.g. at a distance of 60 mm or smaller. In light of the reduced potential of the extractor electrodes or extractor cups, and in light of the shielding of the extractor cups, small insulators 632/732 for carrying the extractor can be provided.

According to yet further modification thereof, the individual extractor cups may be reduced to narrow units. For example, cylindrical cups having a first portion including the aperture opening and a second portion having a cylindrical portion surrounding the optical axis, and a conical transition portion between the first and the second portion can be reduced in one or both lateral dimensions as long as the first portion providing the field symmetry is not affected by the reducing the cup dimension in one or two directions, e.g. in the form of slices. The rotational symmetry is only required in the vicinity of the tip. The overall shielding function does not ask for symmetry. A shielding in the volume surrounding the emitter structure could also be provided by a common shield.

The above mentioned control of emission current by a small extraction voltage provided by power supply 706, which can, for example, be referred to ground potential, is beneficial in multi column systems, where the beam currents in the individual columns need to be precisely matched.

The embodiments described herein, may as well include additional components (not shown) such as condenser lenses, deflectors of the electrostatic, magnetic or compound electrostatic-magnetic type, such as Wien filters, scanning deflectors of the electrostatic, magnetic or compound electrostatic-magnetic type, stigmators of the electrostatic, magnetic or compound electrostatic-magnetic type, further lenses of the electrostatic, magnetic or compound electrostatic-magnetic type, and/or other optical components for influencing and/or correcting the beam of primary and/or secondary charged particles, such as deflectors or apertures. Indeed, for illustration purposes, some of those components are shown in the figures described herein. It is to be understood that one or more of such components can also be applied in embodiments of the invention.

According to embodiments described herein, a simplified emitter assembly with an emitter having an emitter tip, wherein the emitter tip is positioned at a first plane perpendicular to the optical axis and wherein the emitter is configured to be biased to a first potential, an extractor having an opening, wherein the opening is positioned at a second plane perpendicular to the optical axis and wherein the extractor is configured to be biased to a second potential, wherein the second plane has a first distance from the first plane of 2.25 mm an above provides at least one of the following advantages. It can reduce arcing across the extractor insulator and/or extractor feedthrough as compared to the common emitter designs, it can reduce arcing inside the mini module or the emitter insulator/feedthrough, it can reduce arcing between the extractor structure and the vacuum chamber, it can reduce loss in optical performance due to the misalignment of the strong parasitic lens between extractor and the following electrode, such as an anode and/or the first electrode of a condenser, and/or it can reduce or avoid loss in optical performance due to avoidable electron-electron interaction. Yet, a simple and robust mechanical design which can, for example, be operated reliably at high column voltage, when the emitter structure is raised to a high voltage Vacc with respect to the surrounding column parts (vacuum chamber, liner tubes, insulators, feedthroughs, pumps) can be provided. Further, the number of high-voltage feedthroughs configured for 20 kV and above can be reduce, the number of components exposed to high electrical field strength can be reduced and/or the emitter brightness can be improved. The emitter brightness can, for example, be improved by reducing energy broadening of the beam due to an early acceleration, by reducing broadening of the virtual source, and/or by reducing aberrations of the gun lens by reducing parasitic lenses, which are difficult to align. The design practically eliminates the 'parasitic' lens between extractor and condenser. Yet further, it can be possible to improve mechanical alignment of the emitter components and to reduce the distance of the tip to the first (condenser) lens of the system. Further, as described above, arraying of emitters at narrow pitch can be provided more easily and the possibility to incorporate an additional differential vacuum chamber to improve emission stability and/or emitter lifetime can be provided more easily. One or more of the above aspects can be utilized to better enable a high beam current operation. Thereby, in addition to the arraying options, the throughput of a system can be increased.

Figure 8:
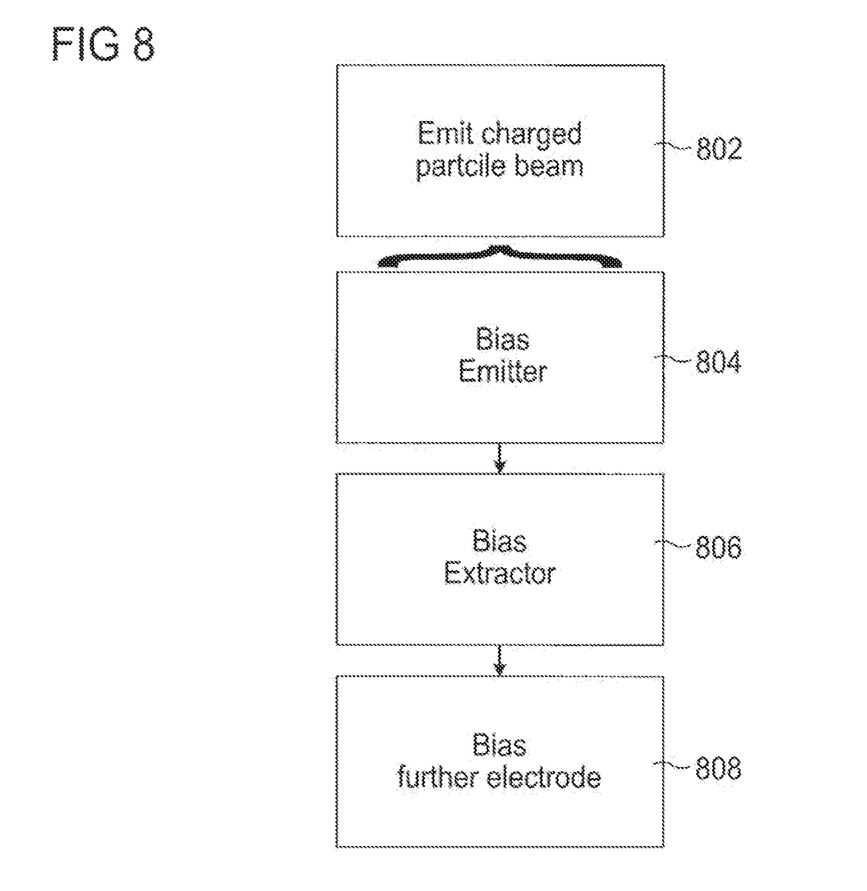
FIG. 8 shows a flow chart illustrating methods of operating emitter assemblies and charged particle beam devices according to embodiments described herein.

As described above, the simplified emitter assemblies described herein have an increased tip-to-extractor difference as compared to the mechanical setup used by the emitter vendors, which is used to qualify the emitter performance and the production of data sheets. This is provided by correspondingly increasing the voltage between the tip and the extractor, and/or by correspondingly decreasing the voltage between the extractor and the further electrode. An acceleration of the electrons is conducted in the first region between the tip and the extractor. Thus, according to embodiments of operating an emitter assembly, the following steps shown in FIG. 8 are provided. In step 802 a charged particle beam, e.g. an electron beam, is emitted. Therefore, in step 804 an emitter is biasing an emitter to a first potential, an extractor is biased in step 804 to a second potential, wherein the voltage between the first potential and the second potential is at least 15 kV, particularly at least 20 kV. As further optional step 808, a further electrode having an opening for trespassing of the charged particle beam is biased to a third potential, wherein the voltage between the second potential and the third potential is 15 kV or below, particularly 10 kV or below. According to typical embodiments, which can be combined with other embodiments described herein, the voltage of the extractor can typically be 10% to 15% of the acceleration voltage Vacc.

As described above, a plurality of embodiments has been described. Thereby, according to one embodiment, an emitter assembly for emitting a charged particle beam along an optical axis is provided. The emitter assembly being housed in a gun chamber and includes an emitter having an emitter tip, wherein the emitter tip is positioned at a first plane perpendicular to the optical axis and wherein the emitter is configured to be biased to a first potential, an extractor having an opening, wherein the opening is positioned at a second plane perpendicular to the optical axis and wherein the extractor is configured to be biased to a second potential, wherein the second plane has a first distance from the first plane of 2.25 mm and above. According to optional modifications thereof, at least one of the following features can be utilized, which are of the group consisting of: the assembly can further include an extractor support supporting the extractor, wherein the extractor support is connected to the extractor and being connectable to a housing of the gun chamber, particularly wherein the extractor support is an insulating extractor support configured to prevent arcing only for voltages of 10 kV and below; for example, the extractor support can be adapted to separate the gun chamber in a first vacuum region and a second vacuum region; the extractor can have a cup-like shape, particularly wherein the extractor includes a first portion with the opening, which is essentially perpendicular to the optical axis, and a second portion surrounding the optical axis and being adapted to shield the first potential applied to the emitter; the emitter or the extractor is movable such that the first distance can be varied; and the assembly further includes a suppressor configured to be biased to a suppressor potential, wherein the suppressor potential can be varied.

According to another embodiment a gun chamber for a charged particle beam device is provided. The gun chamber includes an emitter assembly and an electrode having an opening for trespassing of the charged particle beam and being configured to be biased to a third potential. The emitter assembly includes an emitter having an emitter tip, wherein the emitter tip is positioned at a first plane perpendicular to the optical axis and wherein the emitter is configured to be biased to a first potential, an extractor having an opening, wherein the opening is positioned at a second plane perpendicular to the optical axis and wherein the extractor is configured to be biased to a second potential, wherein the second plane has a first distance from the first plane of 2.25 mm and above. According to optional modifications thereof, at least one of the following features can be utilized, which are of the group consisting of: the gun chamber can include a housing of the gun chamber having at least one vacuum connection adapted for connecting a vacuum pump, wherein the extractor support is connected to the extractor and the housing of the gun chamber; the gun chamber can include a second vacuum connection adapted for connecting a vacuum pump, wherein the vacuum connection is positioned to evacuate the first vacuum region and the further vacuum connection is positioned to evacuate the second vacuum region; and the electrode can be positioned at a second plane perpendicular to the optical axis and wherein the distance between the third plane and the second plane is smaller than 1.5 times the first distance.

According to a yet further embodiment, a charged particle beam device is provided. The charged particle beam device includes one or more, typically at least two emitter assemblies. Each of the one or more emitter assemblies includes an emitter having an emitter tip, wherein the emitter tip is positioned at a first plane perpendicular to the optical axis and wherein the emitter is configured to be biased to a first potential, an extractor having an opening, wherein the opening is positioned at a second plane perpendicular to the optical axis and wherein the extractor is configured to be biased to a second potential, wherein the second plane has a first distance from the first plane of 2.25 mm and above. Thereby, each of the emitters of is connected to one power supply for providing the first potential to the one or more emitters. According to optional modifications thereof, the one or more, typically tow or more, emitter assemblies can be provided within a gun chamber according to embodiments described herein.

According to an even further embodiment, a method of operating an emitter assembly is provided. The method includes emitting a charged particle beam along an optical axis, biasing an emitter to a first potential, and biasing an extractor to a second potential, wherein the voltage between the first potential and the second potential is at least 15 kV, particularly at least 20 kV. According to optional modifications thereof, at least one of the following features can be utilized, which are of the group consisting of: the method can include biasing an electrode having an opening for trespassing of the charged particle beam to a third potential, wherein the voltage between the second potential and the third potential is 15 kV or below, particularly 10 kV or below; the first potential can be shielded by a portion of the extractor surrounding the optical axis; and the beam current can be varied by varying the tip-to-suppressor voltage.

While the foregoing is directed to embodiments of the invention, other and further embodiments of the invention may be devised without departing from the basic scope thereof, and the scope thereof is determined by the claims that follow.

The invention claimed is:

1. A charged particle beam device configured for forming a high energy charged particle beam within the charged particle beam device, the charged particle beam device comprising:
    a gun chamber;
    an emitter assembly housed in the gun chamber for emitting an electron beam along an optical axis, the emitter assembly comprising:
        a field emitter having an emitter tip, wherein the emitter tip is positioned at a first plane perpendicular to the optical axis and wherein the field emitter is configured to be biased to a first potential; and
        an extractor comprising an extraction electrode having an opening, wherein the opening of the extraction electrode is positioned at a second plane coinciding with a smallest opening of the extractor perpendicular to the optical axis, wherein the extractor is configured to be biased to a second potential, wherein the second plane has a first distance from the first plane of 2.25 mm or above, and wherein the extractor is connected either directly to ground or to a control power supply via a low voltage feedthrough providing a feedthrough for a connection between the control power supply or ground and the extractor through a wall of the gun chamber for voltages of 15 kV or below, while said control power supply is connected directly to ground;
    an acceleration potential power supply connected to the emitter tip and configured to bias the emitter tip to an acceleration voltage; and
    a landing energy power supply configured to provide a potential to a specimen, wherein the charged particle beam device is configured to accelerate the electron beam to a beam energy within a column being at least 10 times higher compared to a landing energy of the charged particles.

2. The charged particle beam device according to claim 1, further comprising an extractor support supporting the extractor, wherein the extractor support is connected to the extractor and being connectable to a housing of the gun chamber.

3. The charged particle beam device according to claim 2, wherein the extractor support is an insulating extractor support configured to prevent arcing only for voltages of 10 kV and below.

4. The charged particle beam device according to claim 2, wherein the extractor support is adapted to separate the gun chamber into a first vacuum region and a second vacuum region.

5. The charged particle beam device according to claim 1, wherein the extractor has a cup-like shape having a central opening and a wall extending toward the emitter tip.

6. The charged particle beam device according to claim 5, wherein the extractor includes a first portion with the central opening, which the central opening is essentially perpendicular to the optical axis, and a second portion surrounding the optical axis and being adapted to shield the first potential applied to the emitter.

7. The charged particle beam device according to claim 1, wherein the control power supply is adapted to provide a control voltage of 10 kV or below, and/or wherein an adjustment of a field strength at the emitter tip is provided by a further power supply to a suppressor.

8. The charged particle beam device according to claim 1, further comprising a suppressor configured to be biased to a suppressor potential by a suppressor power supply to vary the suppressor potential.

9. The charged particle beam device according to claim 4, wherein the gun chamber further comprises an electrode having an opening for trespassing of the charged particle beam and being configured to be biased to a third potential.

10. The charged particle beam device according to claim 9, further comprising a housing of the gun chamber having at least one vacuum connection adapted for connecting a vacuum pump, wherein the extractor support is connected to the extractor and the housing of the gun chamber.

11. The charged particle beam device according to claim 10, further comprising a second vacuum connection positioned to evacuate the first vacuum region and adapted for connecting a vacuum pump and a third vacuum connection positioned to evacuate the second vacuum region.

12. The charged particle beam device according to claim 9, wherein the electrode is positioned at a third plane perpendicular to the optical axis and wherein the distance between the third plane and the second plane is smaller than 1.5 times the first distance.

13. The charged particle beam device according to claim 1, further comprising at least a second emitter assembly, the second emitter assembly comprising:
  a second field emitter having a second emitter tip, wherein the second emitter tip is positioned at a third plane perpendicular to the optical axis and wherein the second field emitter is configured to be biased to the first potential; and
  a second extractor comprising a second extraction electrode having a second opening, wherein the second opening of the second extraction electrode is positioned at a fourth plane coinciding with a smallest opening of the second extractor perpendicular to the optical axis and wherein the second extractor is configured to be biased to a third potential, wherein the fourth plane has a second distance from the third plane of 2.25 mm or above.

14. The charged particle beam device according to claim 13, wherein each of the emitter and the second emitter of the emitter assembly and the second emitter assembly is connected to one power supply for providing the first potential to each of the emitter and the second emitter.

15. The charged particle beam device according to claim 1, wherein the emitter or the extractor is movable at least the first distance.

16. The charged particle beam device according to claim 1, wherein the control power supply is adapted to provide a control voltage of 10 kV or below.

17. The charged particle beam device according to claim 1, further comprising a suppressor power supply to adjust a field strength at the emitter tip.

18. The charged particle device of claim 1, further comprising a condenser lens disposed outwardly from the column.

19. The charged particle device of claim 1, further comprising a detector located between the column and the specimen.

* * * * *

UNITED STATES PATENT AND TRADEMARK OFFICE
CERTIFICATE OF CORRECTION

PATENT NO. : 10,699,867 B2
APPLICATION NO. : 15/970440
DATED : June 30, 2020
INVENTOR(S) : Stefan Lanio et al.

Page 1 of 1

It is certified that error appears in the above-identified patent and that said Letters Patent is hereby corrected as shown below:

In the Specification

In Column 7, Line 57, delete "voltages," and insert -- voltages. --, therefor.

In the Claims

In Column 18, Line 39, in Claim 18, after "particle" insert -- beam --.

In Column 18, Line 42, in Claim 19, after "particle" insert -- beam --.

Signed and Sealed this
Twenty-fifth Day of August, 2020

Andrei Iancu
*Director of the United States Patent and Trademark Office*